(12) United States Patent
Kobayashi

(10) Patent No.: US 12,520,449 B2
(45) Date of Patent: Jan. 6, 2026

(54) OPERATION PANEL FOR MACHINE TOOL

(71) Applicant: DMG MORI CO., LTD., Nara (JP)

(72) Inventor: Hiroshi Kobayashi, Nara (JP)

(73) Assignee: DMG MORI CO., LTD., Nara (JP)

( * ) Notice: Subject to any disclaimer, the term of this patent is extended or adjusted under 35 U.S.C. 154(b) by 341 days.

(21) Appl. No.: 18/034,169

(22) PCT Filed: Oct. 27, 2020

(86) PCT No.: PCT/JP2020/040203
§ 371 (c)(1),
(2) Date: Apr. 27, 2023

(87) PCT Pub. No.: WO2022/091200
PCT Pub. Date: May 5, 2022

(65) Prior Publication Data
US 2023/0389220 A1    Nov. 30, 2023

(51) Int. Cl.
*H05K 7/20* (2006.01)
*B23Q 11/12* (2006.01)

(52) U.S. Cl.
CPC ....... *H05K 7/20145* (2013.01); *B23Q 11/126* (2013.01); *H05K 7/20154* (2013.01); *H05K 7/20172* (2013.01); *H05K 7/2039* (2013.01)

(58) Field of Classification Search
CPC ...... G06F 1/20; G06F 1/181; G06F 2200/201; H05K 7/20145; H05K 7/20136; H05K 7/20172; H05K 7/20154; H05K 7/2039; H05K 1/0203; H05K 7/20163; H05K 7/20727; H05K 9/0041; H05K 7/20; H05K 7/20009; H05K 7/20127; H05K 7/20209; H05K 7/20409; H01L 23/467; H01L 23/3672; H01L 23/34; G11B 33/142; B25J 19/0054; F04D 19/002; F04D 29/281; F04D 29/4226; H02K 9/06; H02K 9/02; H02K 5/207; H02K 5/18; B23Q 11/126

See application file for complete search history.

(56) References Cited

U.S. PATENT DOCUMENTS

| 5,689,403 | A | * | 11/1997 | Robertson, Jr. | ........ | H04B 1/036 |
| | | | | | | 415/128 |
| 8,385,065 | B2 | * | 2/2013 | Weaver | ................ | G03B 37/02 |
| | | | | | | 165/122 |
| 9,059,146 | B2 | * | 6/2015 | Inoue | ........................ | G06F 1/20 |
| 9,795,055 | B1 | * | 10/2017 | Campbell | ................ | G06F 1/20 |

(Continued)

FOREIGN PATENT DOCUMENTS

| JP | H08-065825 A | 3/1996 |
| JP | 2013044249 A | 3/2013 |
| JP | 2016-530658 A | 9/2016 |

*Primary Examiner* — Michael A Matey
(74) *Attorney, Agent, or Firm* — IP Business Solutions, LLC

(57) ABSTRACT

An operation panel for a machine tool includes: a first case that accommodates a cooling target object; a blower device that is disposed in the first case; and an air guide member that forms an air flow passage in the first case and that guides air blown out from the blower device toward the cooling target object through the air flow passage. The air flow passage includes an expanded flow passage section in which a flow passage area of the air flow passage increases from an upstream side of an airflow toward a downstream side of the airflow.

6 Claims, 13 Drawing Sheets

(56) References Cited

U.S. PATENT DOCUMENTS

| | | | |
|---|---|---|---|
| 10,842,042 B2* | 11/2020 | Kim | G08B 13/19634 |
| 10,908,270 B2* | 2/2021 | Gupta | A61B 8/4272 |
| 11,109,509 B2* | 8/2021 | He | F04D 29/422 |
| 11,262,819 B2* | 3/2022 | Kuo | G06F 1/203 |
| 11,340,669 B2* | 5/2022 | Liao | G06F 1/203 |
| 11,547,017 B2* | 1/2023 | Uchino | G06F 1/203 |
| 12,075,593 B2* | 8/2024 | Tsuchida | G06F 1/20 |
| 2006/0181846 A1* | 8/2006 | Farnsworth | G06F 1/20 |
| | | | 361/695 |
| 2008/0144281 A1* | 6/2008 | Chen | G06F 1/20 |
| | | | 361/695 |
| 2011/0097195 A1* | 4/2011 | Horng | F04D 29/4226 |
| | | | 415/121.2 |
| 2013/0068425 A1* | 3/2013 | Lu | H01L 23/467 |
| | | | 165/104.34 |
| 2013/0071238 A1 | 3/2013 | Lu | |
| 2014/0036440 A1* | 2/2014 | Inoue | H05K 7/20172 |
| | | | 361/692 |
| 2015/0003859 A1* | 1/2015 | Tanida | H05K 7/20145 |
| | | | 399/92 |
| 2016/0221139 A1 | 8/2016 | Seitz et al. | |
| 2018/0042136 A1 | 2/2018 | Sugawara et al. | |
| 2018/0095508 A1* | 4/2018 | Yi | H05K 7/20163 |

* cited by examiner

OPERATION PANEL FOR MACHINE TOOL

TECHNICAL FIELD

The invention relates to an operation panel for a machine tool.

BACKGROUND ART

For example, Japanese National Patent Publication No. 2016-530658 (PTL 1) discloses a control console for a numerically controlled machine tool. The control console includes a housing, a screen that is disposed at a front side in the housing, at least one circuit substrate that includes an electric component, and a cooling channel through which fluid can pass.

CITATION LIST

Patent Literature

PTL 1: Japanese National Patent Publication No. 2016-530658

SUMMARY OF INVENTION

Technical Problem

As disclosed in the above-described PTL 1, an operation panel for a machine tool is known. In the operation panel for the machine tool, various cooling target objects whose temperatures rise due to the operating of the machine tool are accommodated in a case of the operation panel, and therefore it is demanded to efficiently cool the cooling target objects in a limited space within the case.

Hence, an object of the invention is to solve the above problem, and to provide an operation panel for a machine tool that can efficiently cool the cooling target object accommodated in the case.

Solution to Problem

An operation panel for a machine tool according to the invention includes: a case that accommodates a cooling target object; a blower device that is disposed in the case; and an air guide member that forms an air flow passage in the case and that guides air blown out from the blower device toward the cooling target object through the air flow passage. The air flow passage includes an expanded flow passage section in which a flow passage area of the air flow passage increases from an upstream side of an airflow toward a downstream side of the airflow.

According to the operation panel for the machine tool configured in this way, since the expanded flow passage section is configured such that the flow passage area of the air flow passage increases from the upstream side of the airflow toward the downstream side of the airflow, it is possible to cause the air to smoothly flow through the expanded flow passage section. Thereby, the flow volume of the air that flows toward the cooling target object increases, and therefore it is possible to enhance the cooling efficiency for the cooling target object.

Moreover, preferably, the blower device includes a plurality of blade sections that is disposed so as to be spaced from each other in a circumferential direction about a predetermined axis and that rotates around the predetermined axis. The expanded flow passage section extends in the circumferential direction about the predetermined axis.

According to the operation panel for the machine tool configured in this way, it is possible to cause the air to smoothly flow through the expanded flow passage section that extends in the circumferential direction about the predetermined axis.

Moreover, preferably, the blower device is an axial-flow type that blows out air in an axial direction about the predetermined axis. The expanded flow passage section extends in the circumferential direction about the predetermined axis, at a position that faces the plurality of blade sections in the axial direction about the predetermined axis.

According to the operation panel for the machine tool configured in this way, it is possible to cause the air to smoothly flow through the expanded flow passage section that extends in the circumferential direction about the predetermined axis at the position that faces the plurality of blade sections.

Moreover, preferably, the blower device further includes a center axis section that has a circular columnar shape around the predetermined axis and that is disposed on a radial-directional inside about the predetermined axis relative to the plurality of blade sections, a motor that is accommodated in the center axis section, a fan guard that surrounds outer circumferences of the plurality of blade sections, and a rib section that extends between the center axis section and the fan guard and along which a wire from the motor is routed. The air guide member includes a wall section that is disposed at a position that overlaps with the rib section as viewed in the axial direction about the predetermined axis. The expanded flow passage section extends around the center axis section from a starting point that is one space separated by the wall section, and further extends in a direction of getting away from the center axis section through the other space separated by the wall section, as viewed in the axial direction about the predetermined axis.

According to the operation panel for the machine tool configured in this way, it is possible to cause the air to smoothly flow through the expanded flow passage section that extends from the one space separated by the wall section in the direction of getting away from the center axis section of the blower device through the other space by the wall section. On this occasion, since the wall section is disposed at the position that overlaps with the rib section that hinders blowing in the blower device, it is possible to keep the blowing volume from the blower device to the air flow passage, regardless of the existence of the wall section.

Moreover, preferably, the expanded flow passage section includes a first zone into which the air blown out from the blower device flows, in which a flow passage depth in the axial direction about the predetermined axis increases from the upstream side of the airflow toward the downstream side of the airflow, and in which a flow passage width in a radial direction about the predetermined axis is constant.

According to the operation panel for the machine tool configured in this way, since the flow passage area of the expanded flow passage section gradually increases with the increase in the flow passage depth in the first zone, it is possible to realize a smooth airflow. Moreover, since the flow passage width is constant in the first zone, it is possible to prevent the increase in the size of the air guide member in the radial direction about the predetermined axis.

Moreover, preferably, the expanded flow passage section further includes a second zone into which the air blown out from the blower device flows, that is disposed on the downstream side of the airflow relative to the first zone, and in which the flow passage depth in the axial direction about the predetermined axis and the flow passage width in the radial direction about the predetermined axis increase from the upstream side of the airflow toward the downstream side of the airflow.

According to the operation panel for the machine tool configured in this way, since the flow passage area of the expanded flow passage section quickly increases with the increase in the flow passage depth and the flow passage width in the second zone, it is possible to realize a further smooth airflow.

Moreover, preferably, the expanded flow passage section further includes a third zone into which the air blown out from the blower device flows, that is disposed on the downstream side of the airflow relative to the second zone, in which the flow passage depth in the axial direction about the predetermined axis is constant, and in which the flow passage width in the radial direction about the predetermined axis increases from the upstream side of the airflow toward the downstream side of the airflow.

According to the operation panel for the machine tool configured in this way, since the flow passage area of the expanded flow passage section gradually increases with the increase in the flow passage width in the third zone, it is possible to realize a smooth airflow. Moreover, since the flow passage depth is constant in the third zone, it is possible to prevent the increase in the size of the air guide member in the axial direction about the predetermined axis.

Moreover, preferably, the operation panel for the machine tool further includes an electronic component. The cooling target object is a heatsink that is disposed so as to be stacked on the electronic component in the axial direction about the predetermined axis and that is connected to the electronic component. The air guide member includes a first planar section to which the blower device is connected and that extends in a planar direction orthogonal to the predetermined axis, a second planar section on which an opening section is provided, that is disposed at a position away from the first planar section in a radial direction about the predetermined axis and deviating from the first planar section in the axial direction about the predetermined axis, and that extends in the planar direction orthogonal to the predetermined axis, the opening section being a section where the air flow passage is opened toward a radial-directional outside about the predetermined axis, and an inclined section that extends between the first planar section and the second planar section in an oblique direction with respect to the predetermined axis. The blower device, the second planar section and the heatsink are provided so as to be arrayed in this order from the radial-directional inside about the predetermined axis to the radial-directional outside about the predetermined axis. The first planar section and the electronic component are provided so as to be arrayed in this order from the radial-directional inside about the predetermined axis to the radial-directional outside about the predetermined axis.

According to the operation panel for the machine tool configured in this way, it is possible to dispose the blower device, the air guide member, the electronic component and the heatsink in a compact space in the axial direction about the predetermined axis.

Advantageous Effects of Invention

As described above, according to the invention, it is possible to provide the operation panel for the machine tool that can efficiently cool the cooling target object accommodated in the case.

DESCRIPTION OF EMBODIMENTS

Figure 1:
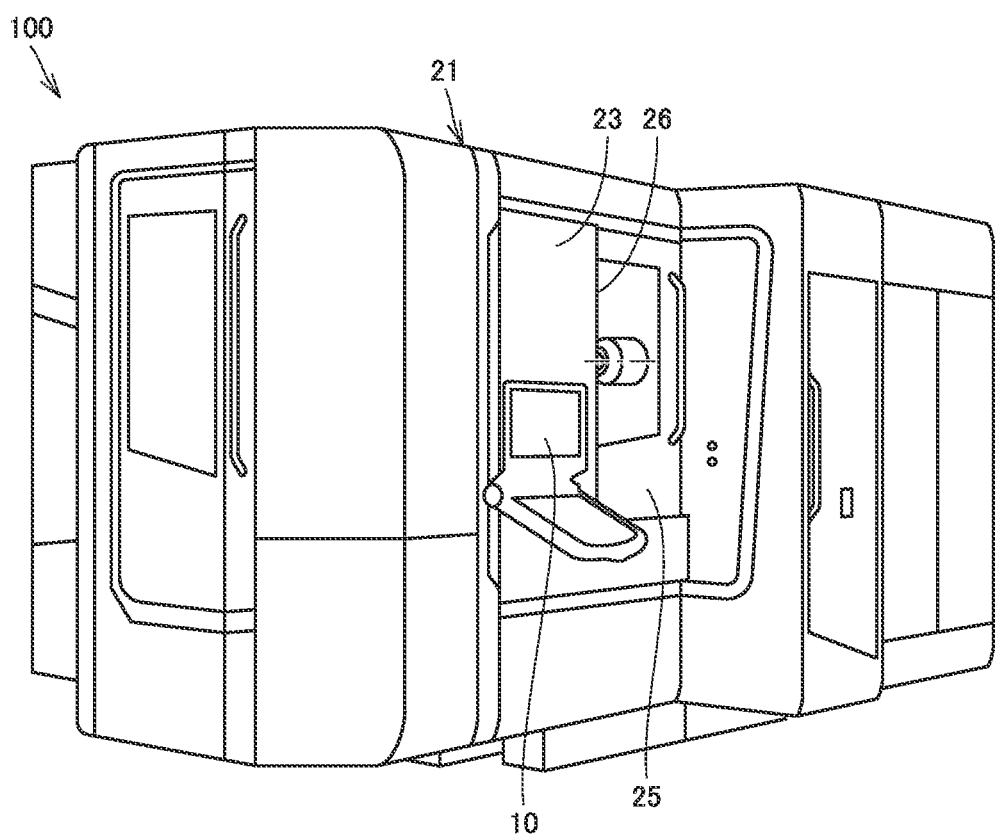
FIG. 1 is a perspective view showing a machine tool for which an operation panel in Embodiment 1 of the invention is used.

With reference to the drawings, embodiments of the invention will be described. In the drawings referred to below, identical or equivalent members are denoted by identical numbers.

Embodiment 1

FIG. 1 is a perspective view showing a machine tool for which an operation panel in Embodiment 1 of the invention is used. With reference to FIG. 1, a machine tool 100 is a machining center that performs workpiece processing by causing a rotating tool to contact with a workpiece, and more particularly, is a horizontal-type machining center in which a rotation center axis of the tool extends in the horizontal direction. Machine tool 100 is an NC (Numerically Control) machine tool in which various actions for workpiece processing are automated under a numerical control by a computer.

Machine tool 100 includes a cover body 21. Cover body 21 performs the compartment formation of a processing area, and forms the external appearance of machine tool 100. The processing area is a space where the processing of the workpiece is performed, and is tightly closed such that foreign substances due to the workpiece processing, as exemplified by chip or coolant, do not leak to the exterior of the processing area.

Cover body 21 includes a front cover 23 and a door section 25. On front cover 23, an opening section 26 is provided. Opening section 26 opens the processing area to the external space. Door section 25 is provided on opening section 26. Door section 25 can slide between an opening position where opening section 26 is in an opening state and a closing position (the position of door section 25 shown in FIG. 1) where opening section 26 is in a closing state.

Machine tool 100 further includes an operation panel 10. Operation panel 10 is provided in the exterior of the processing area. Operation panel 10 is attached to front cover 23. Operation panel 10 is provided so as to be adjacent to opening section 26.

The operation panel in the present invention is not limited to the horizontal-type machining center, and can be applied to a turning machine, a vertical-type machining center, a combined processing machine that has a lathe turning function and a milling function, or an AM/SM hybrid processing machine that can perform an additive processing (AM (Additive manufacturing) processing) for the workpiece and a subtractive processing (SM (Subtractive manufacturing) processing) for the workpiece, for example.

Figure 2:
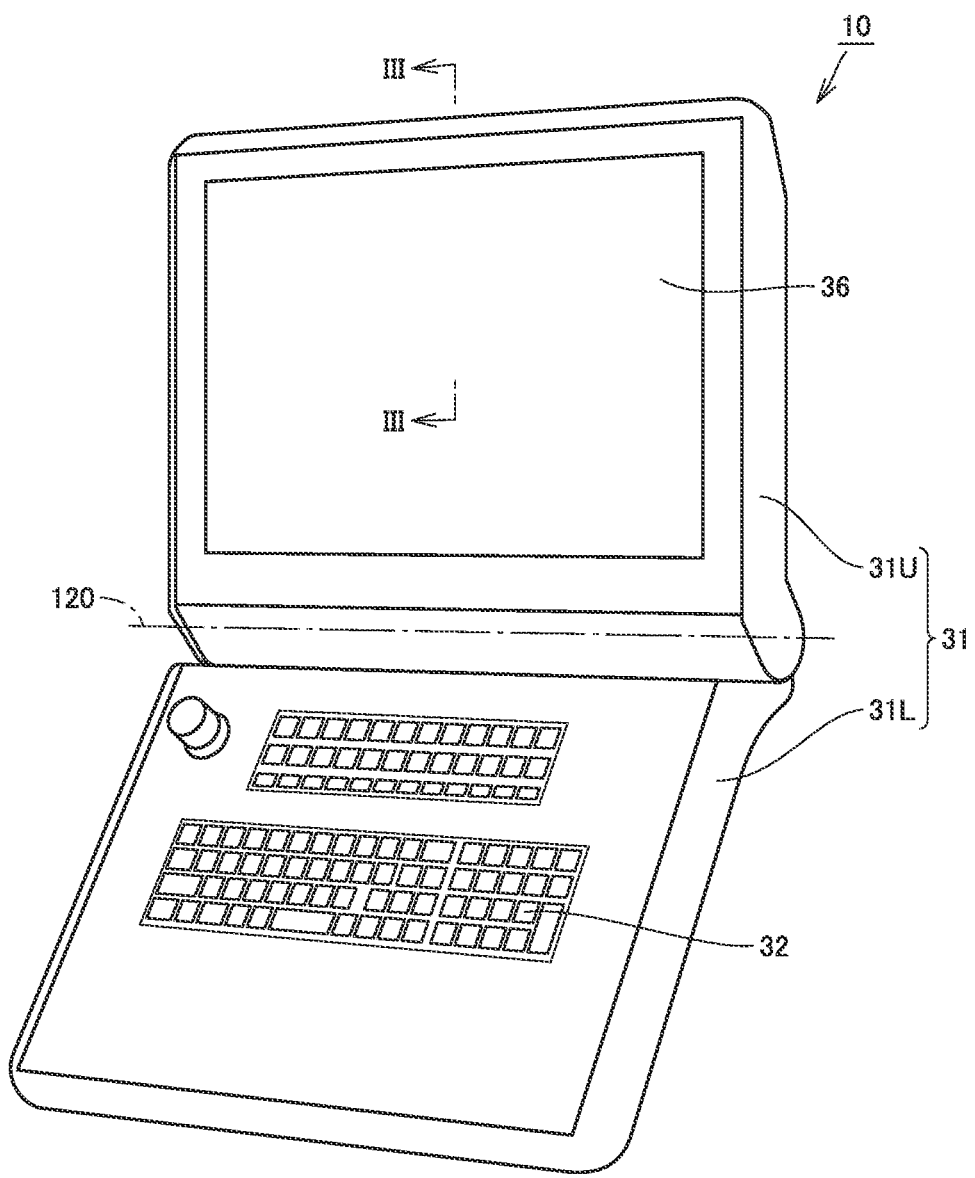
FIG. 2 is a perspective view showing the operation panel in FIG. 1.

Next, the overall structure of operation panel 10 will be described. FIG. 2 is a perspective view showing the operation panel in FIG. 1. With reference to FIG. 2, operation panel 10 includes a case 31. Case 31 forms the external appearance of operation panel 10.

Case 31 includes a first case 31U and a second case 31L. First case 31U is disposed above second case 31L. First case 31U is coupled to second case 31L so as to be capable of pivoting around a pivoting center axis 120. Each of first case 31U and second case 31L has a flat plate shape. Each of first case 31U and second case 31L has a flat plate shape parallel to a plane that contains pivoting center axis 120.

Operation panel 10 includes an operation section 32 for various buttons, dials, switches or others that are used when a worker operates machine tool 100, a display section 36 showing the processing state and others of the workpiece in machine tool 100, and the like. Operation section 32 for buttons, dials, switches or others is provided in second case 31L. Display section 36 is provided in first case 31U.

Figure 3:
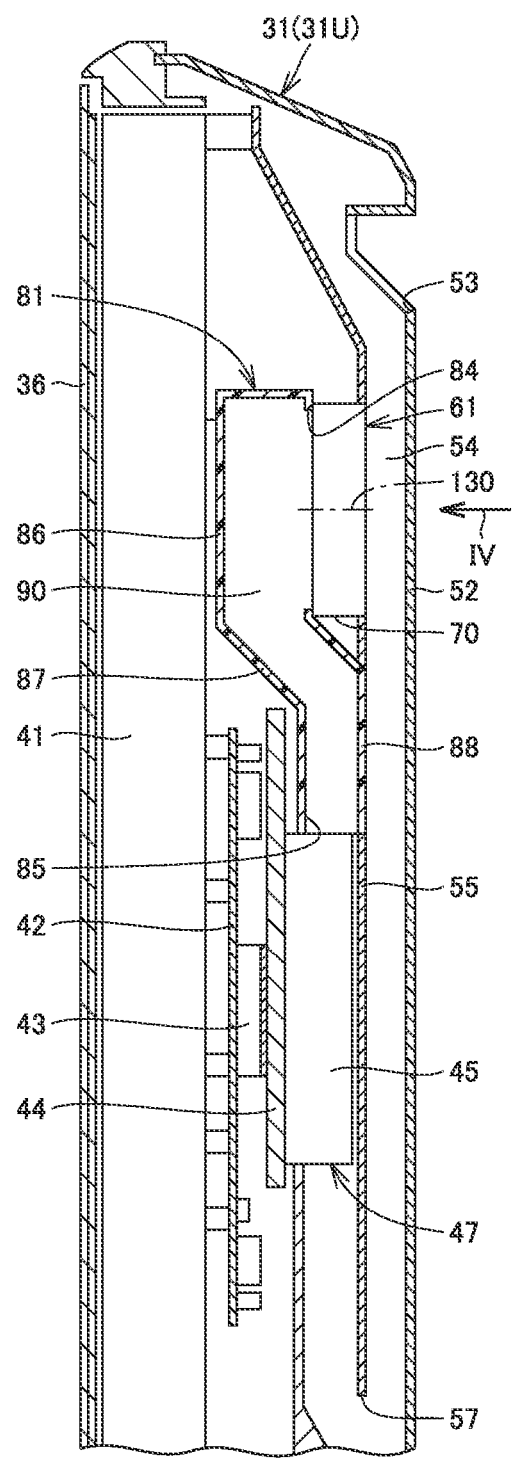
FIG. 3 is a sectional view showing the operation panel as viewed in the direction of the arrow on line in FIG. 2.

FIG. 3 is a sectional view showing the operation panel as viewed in the direction of the arrow on line in FIG. 2. With reference to FIG. 2 and FIG. 3, first case 31U includes an opposed wall 52. Opposed wall 52 is disposed on the back side of display section 36. Opposed wall 52 extends in a planar direction orthogonal to the thickness direction of first case 31U. Opposed wall 52 and display section 36 are disposed so as to be spaced from each other in the thickness direction of first case 31U. Opposed wall 52 performs the compartment formation of an internal space that accommodates a later-described blower device 61 and the like, together with display section 36.

Operation panel 10 further includes a partition wall section 55. Partition wall section 55 is disposed in first case 31U. Partition wall section 55 faces opposed wall 52 so as to be spaced. Partition wall section 55 extends parallel to opposed wall 52. The distance between opposed wall 52 and partition wall section 55 in the thickness direction of first case 31U is smaller than the distance between display section 36 and partition wall section 55 in the thickness direction of first case 31U.

An air passage 54 is formed between opposed wall 52 and partition wall section 55. An intake port 53 is provided on opposed wall 52. Intake port 53 is constituted by a through-hole that passes through opposed wall 52. Intake port 53 provides communication between air passage 54 and the exterior of first case 31U.

Operation panel 10 further includes a display device 41. Display device 41 is constituted by a display panel such as a liquid crystal panel or an organic EL. Display device 41 has a thin plate shape, and is disposed parallel to a plane orthogonal to the thickness direction of first case 31U. Display section 36 is constituted by a display surface of display device 41.

Operation panel 10 further includes an electronic component 43 and a heatsink 47. Electronic component 43 and heatsink 47 are disposed between display device 41 and partition wall section 55 in the thickness direction of first case 31U. Electronic component 43 is constituted by a CPU (Central Processing Unit). Electronic component 43 is mounted on a substrate 42. Substrate 42 is disposed parallel to opposed wall 52 and partition wall section 55. Electronic component 43 is disposed on the opposite side of display device 41 with respect to substrate 42.

Heatsink 47 is made of a metal such as aluminum. Heatsink 47 is accommodated in first case 31U. Heatsink 47 is disposed between electronic component 43 and partition wall section 55 in the thickness direction of first case 31U.

Heatsink 47 is connected to electronic component 43. Heatsink 47 is thermally connected to electronic component 43. Grease or a thermally conductive sheet may be interposed between heatsink 47 and electronic component 43. Heatsink 47 is disposed so as to overlap with electronic component 43 in the thickness direction (the axial direction about a later-described center axis 130) of first case 31U.

Heatsink 47 includes a radiator plate 44 and a plurality of fins 45. Radiator plate 44 is disposed parallel to opposed wall 52 and partition wall section 55.

Radiator plate 44 faces substrate 42 through electronic component 43. Radiator plate 44 is connected to electronic component 43. The plurality of fins 45 is disposed between partition wall section 55 and radiator plate 44 in the thickness direction of first case 31U. The plurality of fins 45 is provided integrally with radiator plate 44. The plurality of fins 45 extends from radiator plate 44 toward partition wall section 55. The plurality of fins 45 is disposed so as to be spaced from each other in a direction orthogonal to the thickness direction of first case 31U.

Operation panel 10 further includes blower device 61 and an air guide member 81. Blower device 61 and air guide member 81 are disposed in first case 31U. Blower device 61 and air guide member 81 are disposed between display device 41 and partition wall section 55 in the thickness direction of first case 31U. Blower device 61 is connected to air guide member 81. Blower device 61 is attached to partition wall section 55. Blower device 61 faces opposed wall 52 through air passage 54. Air passage 54 is communicated with a suction side of blower device 61.

Air guide member 81 forms an air flow passage 90 in first case 31U. Air guide member 81 is constituted by a duct that forms air flow passage 90.

An upstream-side opening section 84 and a downstream-side opening section 85 (opening section) are provided in air guide member 81. Air flow passage 90 extends between upstream-side opening section 84 and downstream-side opening section 85. Upstream-side opening section 84 is provided at an end section on the upstream side of the airflow in air flow passage 90. Air flow passage 90 is communicated with an ejection side of blower device 61 through upstream-side opening section 84.

Downstream-side opening section 85 is provided at an end section on the downstream side of the airflow in air flow passage 90. Downstream-side opening section 85 is opened to a space between radiator plate 44 and partition wall section 55. Downstream-side opening section 85 is opened so as to face heatsink 47.

Downstream-side opening section 85 is opened so as to face the plurality of fins 45.

By the drive of blower device 61, the air in the exterior of first case 31U is taken into air passage 54 in first case 31U through intake port 53. The air to flow through air passage 54 is blown out from blower device 61 to air flow passage 90. The air passes through air flow passage 90, and is guided toward heatsink 47 (the plurality of fins 45). The air whose temperature rises by the heat exchange with heatsink 47 flows around an end section 57 of partition wall section 55, and flows to air passage 54. The air flowing to air passage 54 is exhausted to the exterior of first case 31U through an exhaust port (not illustrated) provided on opposed wall 52.

Figure 4:
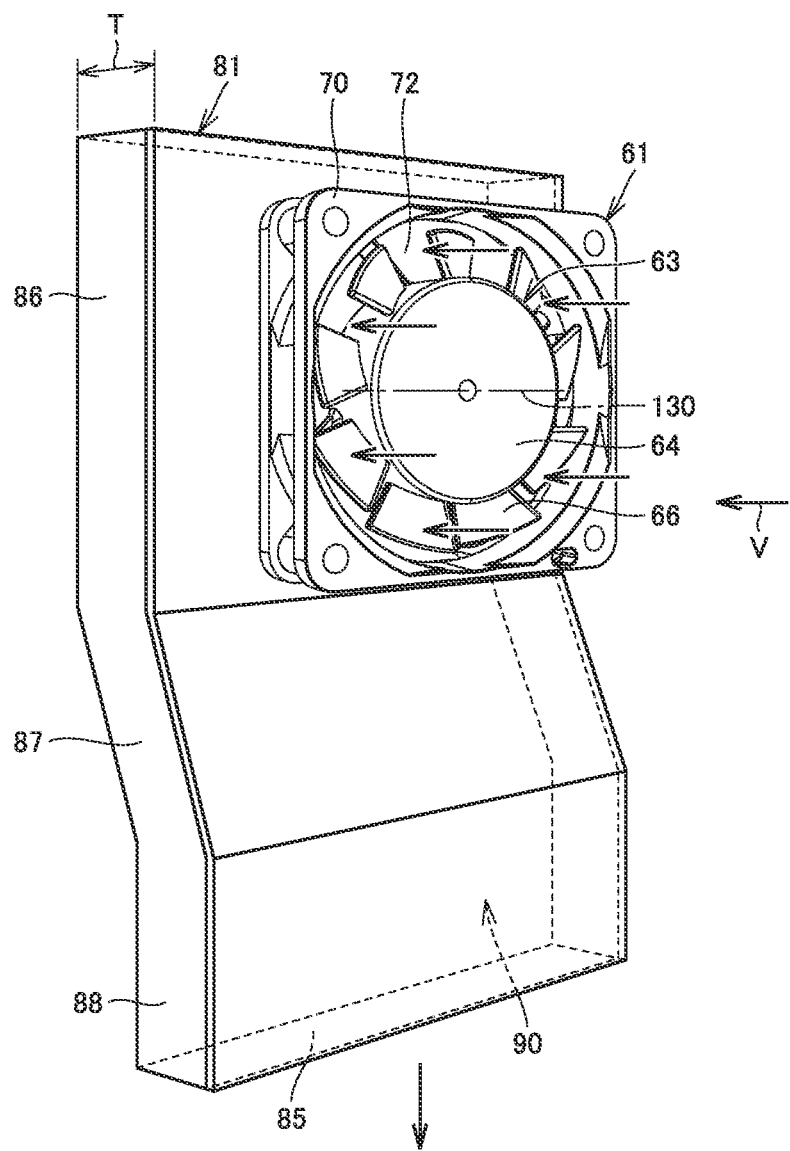
FIG. 4 is a perspective view showing an air guide member and a blower device in FIG. 3.
Figure 5:
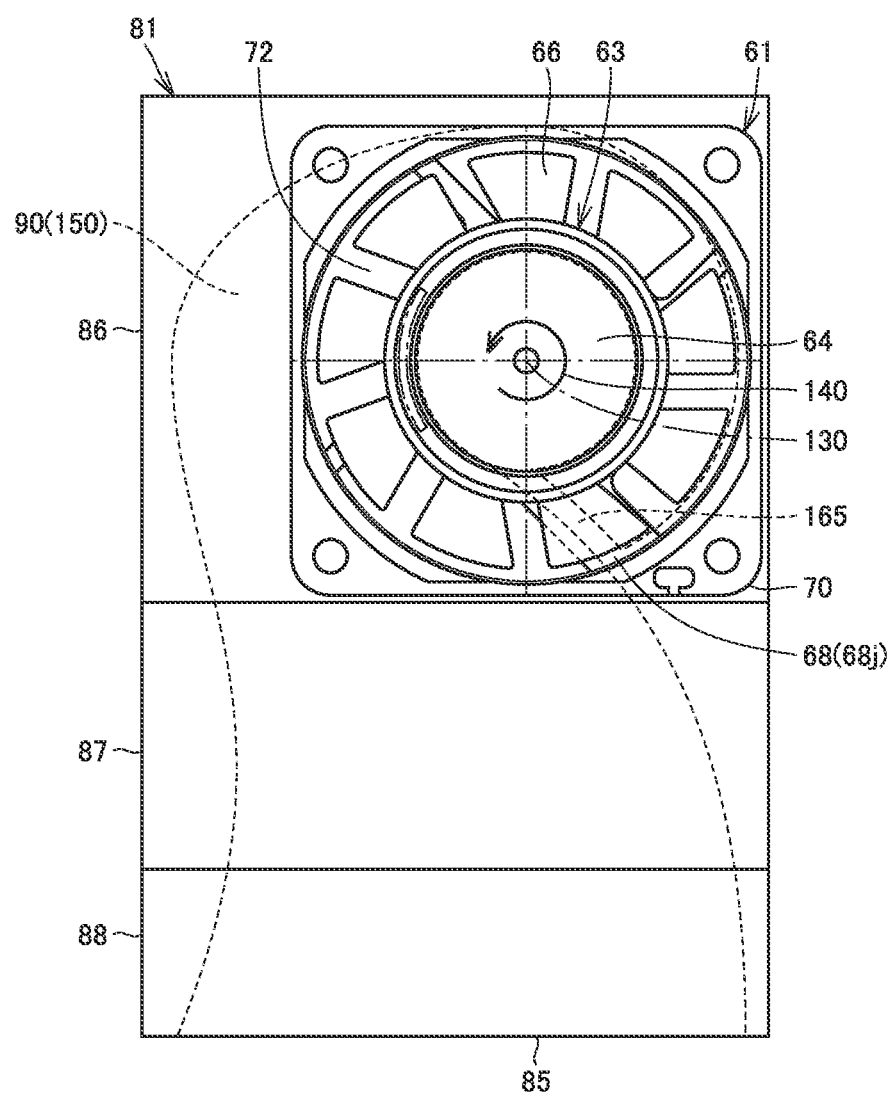
FIG. 5 is a plan view showing the air guide member and the blower device as viewed in the direction indicated by arrow V in FIG. 4.
Figure 6:
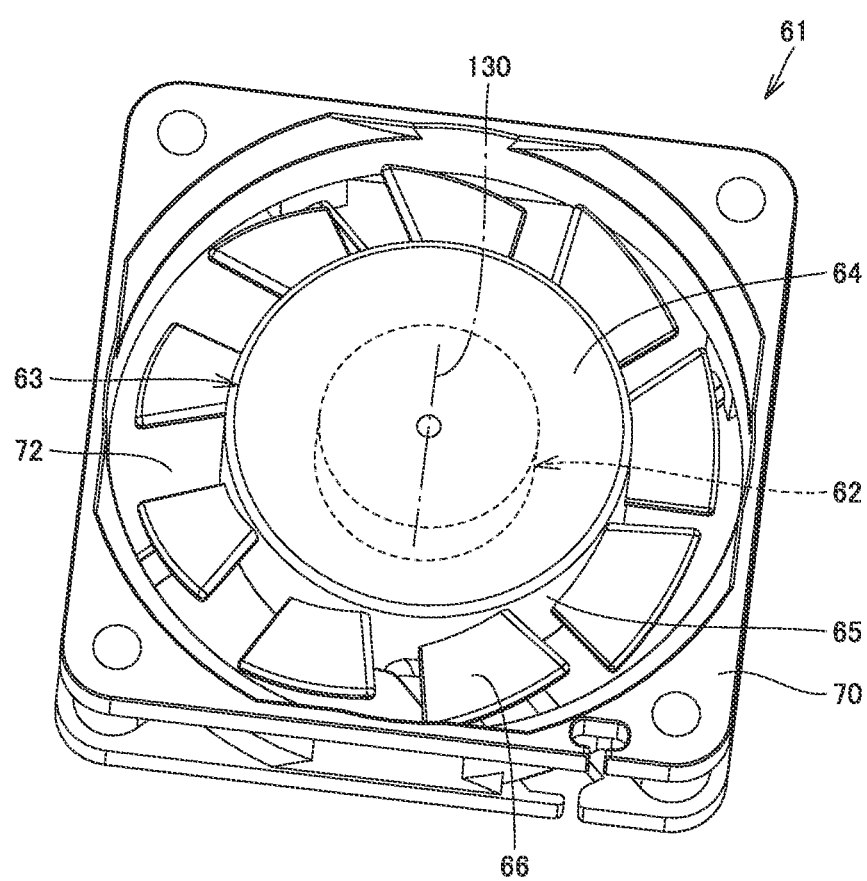
FIG. 6 is a perspective view showing the blower device in FIG. 3.
Figure 7:
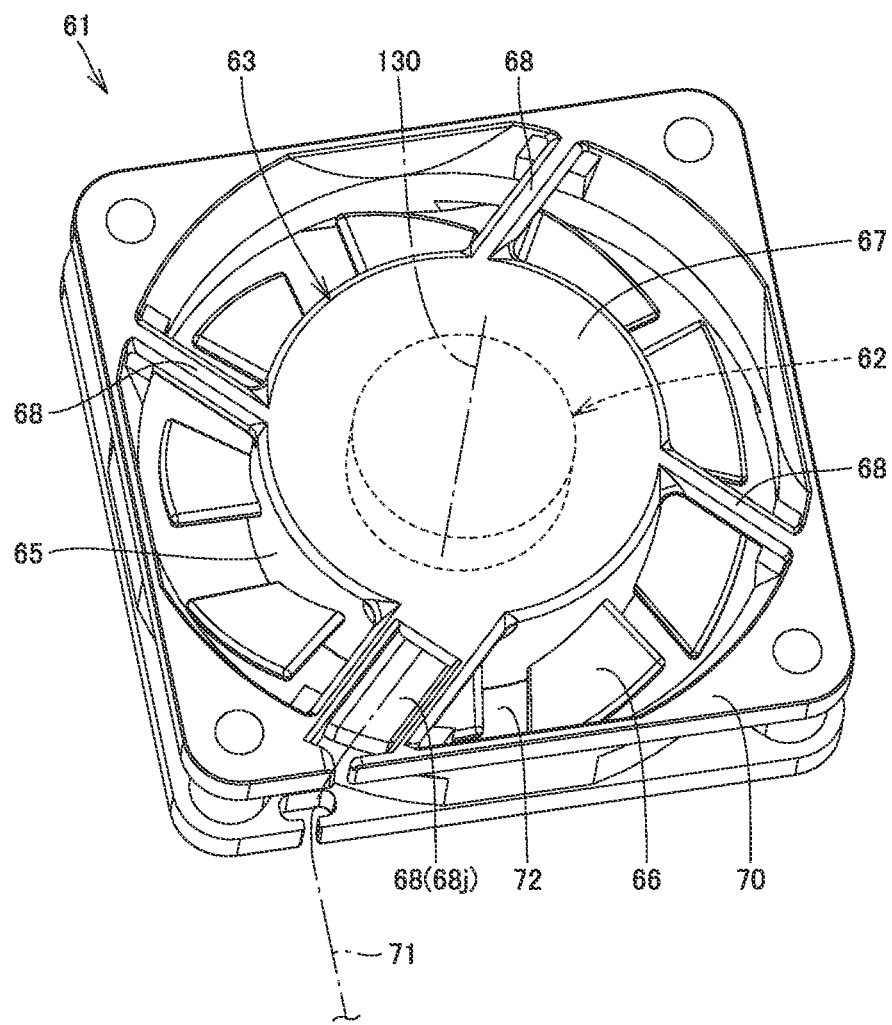
FIG. 7 is another perspective view showing the blower device in FIG. 3.

Next, more specific structures of blower device 61 and air guide member 81 will be described. FIG. 4 is a perspective view showing the air guide member and the blower device in FIG. 3. FIG. 5 is a plan view showing the air guide member and the blower device as viewed in the direction indicated by arrow V in FIG. 4. FIG. 6 and FIG. 7 are perspective views showing the blower device in FIG. 3. In FIG. 6, blower device 61 on the suction side is shown, and in FIG. 7, blower device 61 on the ejection side is shown.

With reference to FIG. 3 to FIG. 7. blower device 61 includes a plurality of blade sections 66, a center axis section 63 and a motor 62.

The plurality of blade sections 66 is disposed so as to be spaced from each other in the circumferential direction about center axis 130, which is a virtual straight line. The plurality of blade sections 66 is provided at regular intervals in the circumferential direction of center axis 130. Center axis 130 extends in the thickness direction of first case 31U. The axial direction about center axis 130 corresponds to the thickness direction of first case 31U.

Blower device 61 is an axial-flow type that blows out air in the axial direction about center axis 130. Blower device 61 is a propeller fan. Blower device 61 has an external appearance having a flat plate shape whose thickness direction is the axial direction about center axis 130. An end face side of blower device 61 that is oriented in one direction along the axial direction about center axis 130 corresponds to the suction side, and an end face side of blower device 61 that is oriented in the reverse direction along the axial direction about center axis 130 corresponds to the ejection side.

Center axis section 63 is provided on the axis of center axis 130. Center axis section 63 has a circular columnar shape around center axis 130. Center axis section 63 is disposed on a radial-directional inside about center axis 130 relative to the plurality of blade sections 66.

Center axis section 63 includes a first disk section 64, a second disk section 67 and a cylinder section 65. First disk section 64 and second disk section 67 have a disk shape around center axis 130. First disk section 64 and second disk section 67 are disposed so as to be spaced from each other in the axial direction about center axis 130. First disk section 64 is disposed on the suction side, and second disk section 67 is disposed on the ejection side.

Cylinder section 65 has a cylinder shape around center axis 130. Cylinder section 65 is connected to first disk section 64 at one end in the axial direction about center axis 130. Cylinder section 65 is isolated from second disk section 67. Root sections of the plurality of blade sections 66 are connected to cylinder section 65.

Motor 62 is accommodated in center axis section 63. Motor 62 is disposed in a space that is surrounded by first disk section 64, second disk section 67 and cylinder section 65. Motor 62 is supported by second disk section 67. An output shaft of motor 62 is connected to first disk section 64. The rotation from motor 62 is transmitted to first disk section 64 and cylinder section 65, and thereby the plurality of blade sections 66 rotates around center axis 130 in the direction indicated by arrow 140 shown in FIG. 5.

Blower device 61 further includes a fan guard 70 and a plurality of rib sections 68. Fan guard 70 is provided so as to surround outer circumferences of the plurality of blade sections 66. Fan guard 70 is provided at a position away from center axis section 63 to a radial-directional outside about center axis 130. The plurality of blade sections 66 is disposed in a space 72 between center axis section 63 and fan guard 70 in the radial direction about center axis 130. A gap is provided between fan guard 70 and the plurality of blade sections 66 in the radial direction about center axis 130.

The plurality of rib sections 68 extends between fan guard 70 and center axis section 63. The plurality of rib sections 68 is disposed so as to be spaced from each other in the circumferential direction about center axis 130. Rib sections 68 extend from the radial-directional inside about center axis 130 toward the radial-directional outside about center axis 130, while deviating in the circumferential direction about center axis 130. Rib sections 68 are continuous with an outer circumferential edge of second disk section 67, at end sections on the radial-directional inside about center axis 130. Rib sections 68 are continuous with fan guard 70, at end sections on the radial-directional outside about center axis 130.

The plurality of rib sections 68 includes a rib section 68j. As shown in FIG. 7, a wire 71 extending from motor 62 is routed along rib section 68j. Wire 71 includes a power wire and signal wire of motor 62. Wire 71 is drawn out from center axis section 63 accommodating motor 62 to fan guard 70 through rib section 68j. The width of rib section 68j in the circumferential direction about center axis 130 is larger than the width of rib sections 68 other than rib section 68j in the circumferential direction about center axis 130.

Air guide member 81 includes a first planar section 86, an inclined section 87 and a second planar section 88. Each of first planar section 86 and second planar section 88 has a flat plate shape whose thickness direction is the axial direction about center axis 130. Inclined section 87 connects first planar section 86 and second planar section 88. Inclined section 87 has a flat plate shape that extends in an oblique direction with respect to first planar section 86 and second planar section 88.

Blower device 61 is connected to first planar section 86. First planar section 86 extends in a planar direction orthogonal to center axis 130. Blower device 61 is provided so as to be stacked on first planar section 86 in the axial direction about center axis 130. Upstream-side opening section 84 is provided on first planar section 86. By upstream-side opening section 84, air flow passage 90 is opened toward the axial direction about center axis 130. Upstream-side opening section 84 is opened in a range where center axis section 63 and space 72 are projected in the axial direction about center axis 130.

Second planar section 88 is disposed at a position away from first planar section 86 in the radial direction about center axis 130 and deviating from first planar section 86 in the axial direction about center axis 130. Second planar section 88 extends in the planar direction orthogonal to center axis 130. Downstream-side opening section is provided on second planar section 88. By downstream-side opening section 85, air flow passage 90 is opened toward the radial-directional outside about center axis 130.

Second planar section 88 is provided at a position that deviates from first planar section 86 in a direction of getting close to partition wall section 55 in the axial direction about center axis 130. Second planar section 88 forms a step shape in the axial direction about center axis 130, together with first planar section 86. Blower device 61 is disposed in the step portion formed by first planar section 86 and second planar section 88.

Inclined section 87 is disposed between first planar section 86 and second planar section 88 in the radial direction about center axis 130. Inclined section 87 extends between first planar section 86 and second planar section 88 in an oblique direction with respect to center axis 130.

Blower device 61, second planar section 88 and heatsink 47 (the plurality of fins 45) are provided so as to be arrayed in this order from the radial-directional inside about center axis 130 to the radial-directional outside about center axis 130. Blower device 61, second planar section 88 and heatsink 47 (the plurality of fins 45) are provided on an identical plane orthogonal to center axis 130. Second planar section 88 is provided so as to face blower device 61 through inclined section 87 in the radial direction about center axis 130. Heatsink 47 (the plurality of fins 45) is provided so as to face second planar section 88 in the radial direction about center axis 130.

First planar section 86 and electronic component 43 are provided so as to be arrayed in this order from the radial-directional inside about center axis 130 to the radial-directional outside about center axis 130. First planar section 86 and electronic component 43 are provided on an identical plane orthogonal to center axis 130. Electronic component 43 is provided so as to face electronic component 43 through inclined section 87 in the radial direction about center axis 130.

Second planar section 88 is provided so as to be stacked on radiator plate 44 in the axial direction about center axis 130.

In this configuration, by using the step shape formed by first planar section 86 and second planar section 88 of air guide member 81, it is possible to dispose blower device 61, air guide member 81, electronic component 43 and heatsink 47 in a compact space in the axial direction about center axis 130. Thereby, it is possible to reduce the thickness of first case 31U.

Figure 8:
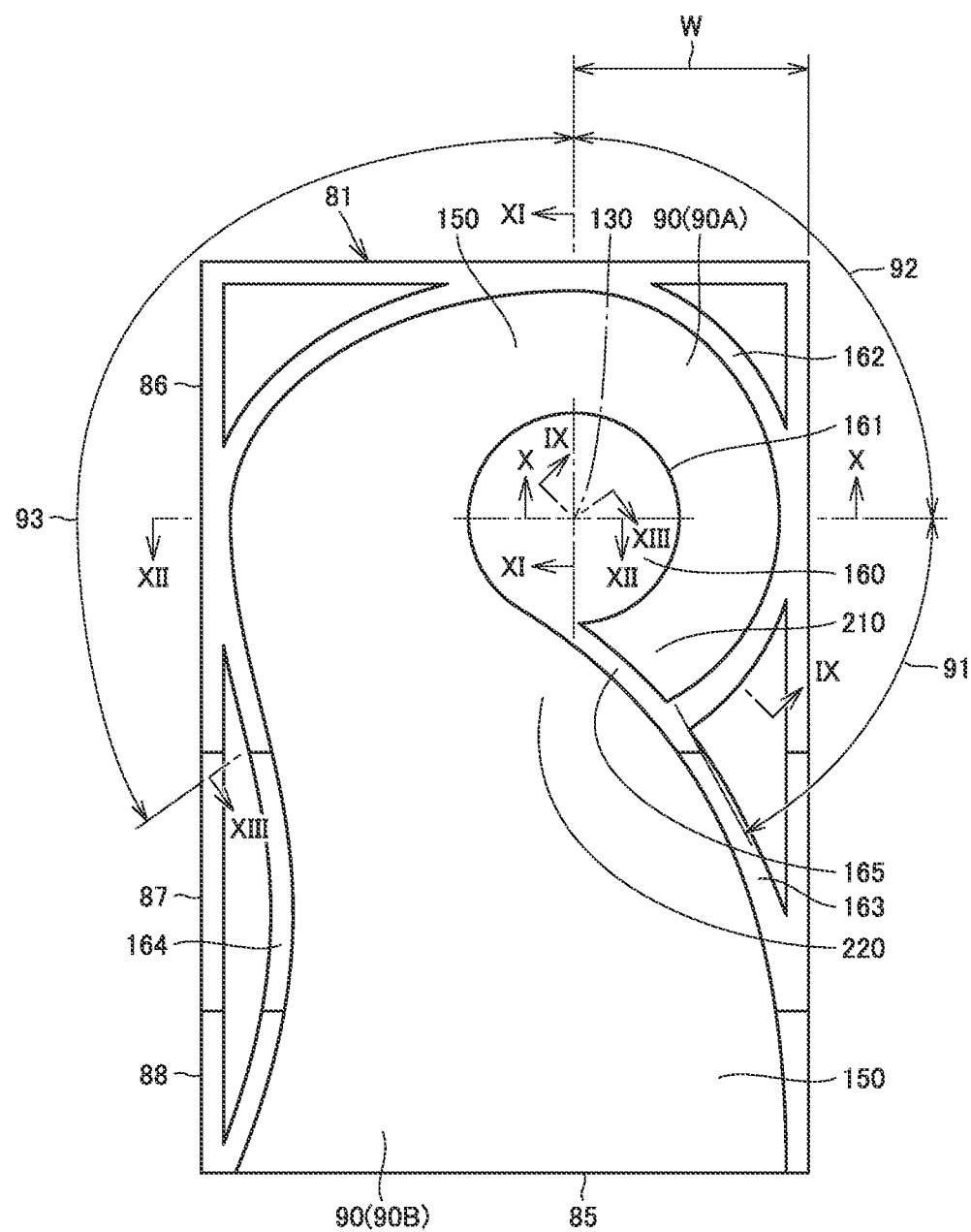
FIG. 8 is a plan view showing the internal structure of the air guide member.
Figure 9:
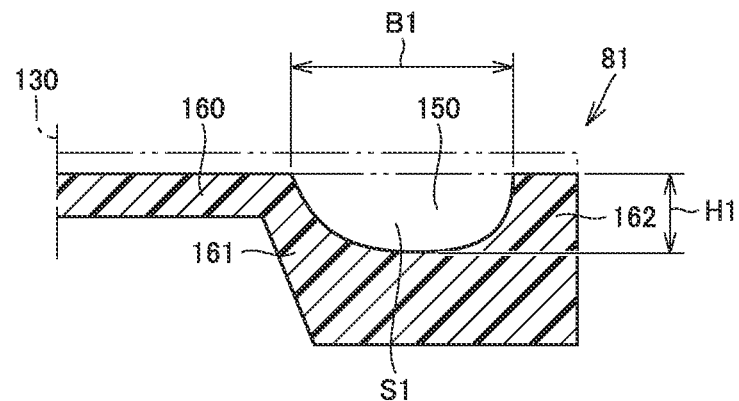
FIG. 9 is a sectional view showing the air guide member as viewed in the direction of the arrow on line IX-IX in FIG. 8.
Figure 10:
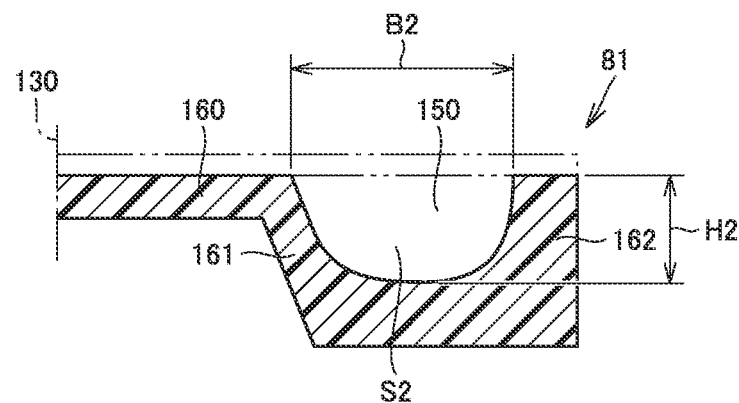
FIG. 10 is a sectional view showing the air guide member as viewed in the direction of the arrow on line X-X in FIG. 8.
Figure 11:
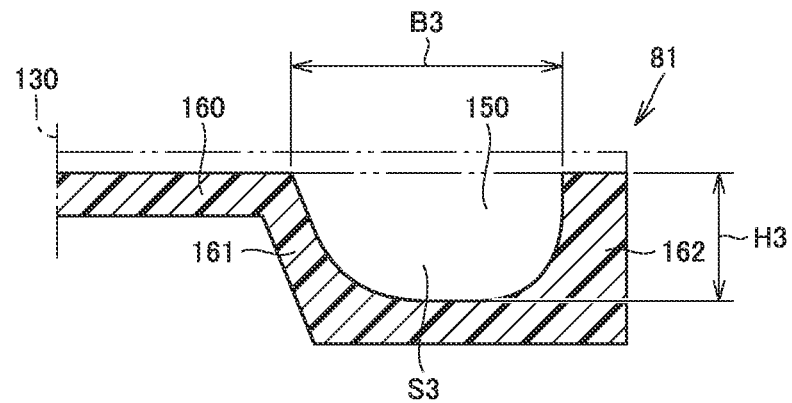
FIG. 11 is a sectional view showing the air guide member as viewed in the direction of the arrow on line XI-XI in FIG. 8.
Figure 12:
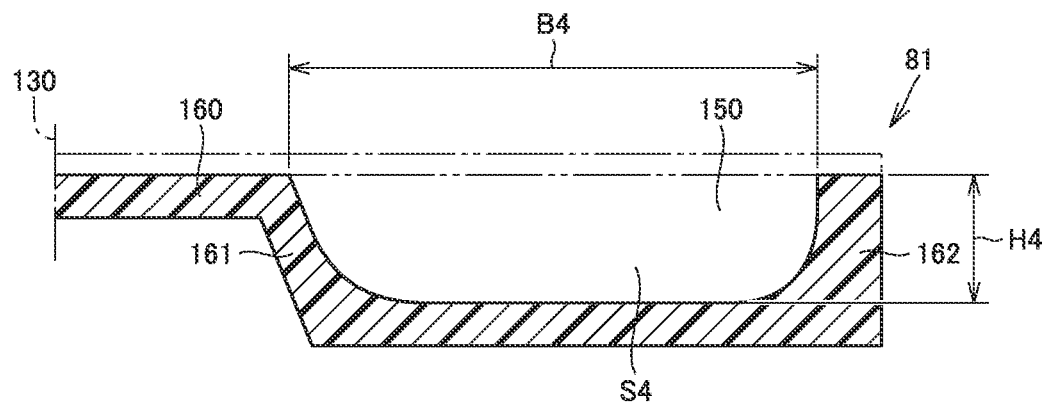
FIG. 12 is a sectional view showing the air guide member as viewed in the direction of the arrow on line XII-XII in FIG. 8.
Figure 13:
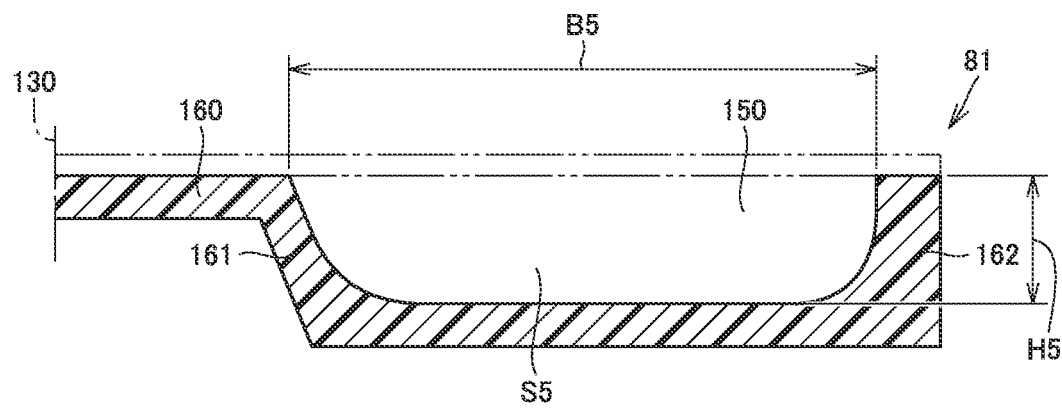
FIG. 13 is a sectional view showing the air guide member as viewed in the direction of the arrow on line XIII-XIII in FIG. 8.

Next, a specific structure of air flow passage 90 provided in air guide member 81 will be described. FIG. 8 is a plan view showing the internal structure of the air guide member. FIG. 9 is a sectional view showing the air guide member as viewed in the direction of the arrow on line IX-IX in FIG. 8. FIG. 10 is a sectional view showing the air guide member as viewed in the direction of the arrow on line X-X in FIG. 8. FIG. 11 is a sectional view showing the air guide member as viewed in the direction of the arrow on line XI-XI in FIG. 8. FIG. 12 is a sectional view showing the air guide member as viewed in the direction of the arrow on line XII-XII in FIG. 8. FIG. 13 is a sectional view showing the air guide member as viewed in the direction of the arrow on line XIII-XIII in FIG. 8.

With reference to FIG. 4 to FIG. 13, air flow passage 90 includes a round section 90A and an extension section 90B.

Round section 90A is opened toward the axial direction about center axis 130 through upstream-side opening section 84. The air blown out from blower device 61 flows into round section 90A. Extension section 90B is disposed on the downstream side of the airflow in air flow passage 90, relative to round section 90A. Extension section 90B is opened toward the radial-directional outside about center axis 130 through downstream-side opening section 85.

Round section 90A extends in the circumferential direction about center axis 130. Round section 90A extends in the circumferential direction about center axis 130, at a position that faces the plurality of blade sections 66 in the axial direction about center axis 130. Round section 90A extends in the circumferential direction about center axis 130, at a position that faces space 72 in the axial direction about center axis 130.

Round section 90A is provided in first planar section 86. Air guide member 81 (first planar section 86) includes a peak section 160, an inner circumferential side wall section 161, and an outer circumferential side wall section 162.

Peak section 160 has a disk shape around center axis 130. Peak section 160 faces center axis section 63 (second disk section 67) of blower device 61 in the axial direction about center axis 130. Inner circumferential side wall section 161 extends from a peripheral section of peak section 160 in a direction of getting away from blower device 61 in the axial direction about center axis 130. Inner circumferential side wall section 161 extends in the circumferential direction about center axis 130 toward the radial-directional outside about center axis 130. Inner circumferential side wall section 161 has a constant radius around center axis 130, regardless of the position in the circumferential direction about center axis 130.

Outer circumferential side wall section 162 extends in the circumferential direction about center axis 130 toward the radial-directional inside about center axis 130. Outer circumferential side wall section 162 faces inner circumferential side wall section 161 in the radial direction about center axis 130. Round section 90A is formed between inner circumferential side wall section 161 and outer circumferential side wall section 162 in the radial direction about center axis 130.

Extension section 90B extends from an end section of round section 90A on the downstream side of the airflow in air flow passage 90 toward downstream-side opening section 85. Extension section 90B extends from the radial-directional inside about center axis 130 toward the radial-directional outside about center axis 130.

Extension section 90B is provided in inclined section 87 and second planar section 88. Air guide member 81 (inclined section 87, second planar section 88) includes a first side wall section 163 and a second side wall section 164. First side wall section 163 and second side wall section 164 face each other. First side wall section 163 extends from a later-described wall section 165 toward the opening rim of downstream-side opening section 85. Second side wall section 164 extends from outer circumferential side wall section 162 toward the opening rim of downstream-side opening section 85.

Extension section 90B is formed between first side wall section 163 and second side wall section 164. The distance between first side wall section 163 and second side wall section 164 increases from the upstream side of the airflow in air flow passage 90 toward the downstream side of the airflow in air flow passage 90.

Air guide member 81 (first planar section 86) further includes wall section 165. Wall section 165 extends between inner circumferential side wall section 161 and first side wall section 163. Wall section 165 extends from the radial-directional inside about center axis 130 toward the radial-directional outside about center axis 130, while deviating in the circumferential direction about center axis 130. The width of wall section 165 in the circumferential direction about center axis 130 is smaller than the width of rib section 68j in the circumferential direction about center axis 130.

As shown in FIG. 5, wall section 165 is disposed at a position that overlaps with rib section 68j as viewed in the axial direction about center axis 130. It is allowable to adopt a configuration in which wall section 165 and rib section 68j partially overlap with each other as viewed in the axial direction about center axis 130.

Air flow passage 90 includes an expanded flow passage section 150. A flow passage area of expanded flow passage section 150 increases from the upstream side of the airflow toward the downstream side of the airflow. The flow passage area of expanded flow passage section 150 is the opening area of expanded flow passage section 150 when expanded flow passage section 150 is cut by a plane orthogonal to the airflow in air flow passage 90.

In the embodiment, expanded flow passage section 150 exists over the whole range of round section 90A and extension section 90B. As shown in FIG. 5 and FIG. 8, expanded flow passage section 150 extends around center axis section 63 from a starting point that is one space 210 separated by wall section 165, and further extends in a direction of getting away from center axis section 63 through the other space 220 separated by wall section 165, as viewed in the axial direction about center axis 130. Space 210 and space 220 are provided on both sides of wall section 165 as viewed in the axial direction about center axis 130.

A direction in which expanded flow passage section 150 (round section 90A) extends around center axis 130 from space 210 as the starting point toward space 220 is the same as the rotation direction of the plurality of blade sections 66 in blower device 61.

In this configuration, expanded flow passage section 150 is configured such that the flow passage area of air flow passage 90 increases from the upstream side of the airflow toward the downstream side of the airflow, and therefore it is possible to cause the air to smoothly flow through expanded flow passage section 150.

Moreover, in the embodiment, the air blown out from blower device 61 flows into round section 90A in the axial direction about center axis 130, and after the change in the direction to the circumferential direction about center axis 130, flows from the upstream side of the airflow in air flow passage 90 toward the downstream side of the airflow in air flow passage 90. In this case, the flow volume of the airflow in round section 90A increases from the upstream side of the airflow in air flow passage 90 toward the downstream side of the airflow in air flow passage 90, and therefore the pressure of the downstream side of the airflow is higher than the pressure of the upstream side of the airflow. In response to this, the flow passage area of round section 90A increases from the upstream side of the airflow toward the downstream side of the airflow, and therefore it is possible to cause the air to smoothly flow through round section 90A.

For the above reason, it is possible to increase the flow volume of the air that is supplied to heatsink 47, and to enhance the cooling efficiency of heatsink 47 and electronic component 43.

Further, in the embodiment, wall section 165 is provided at the position that overlaps with rib section 68j that hinders the blowing from blower device 61 to air flow passage 90, as viewed in the axial direction about center axis 130. Therefore, it is possible to keep the blowing volume from blower device 61 to air flow passage 90, regardless of the existence of wall section 165.

With respect to FIG. 8 to FIG. 13, expanded flow passage section 150 (round section 90A) includes a first zone 91, a second zone 92 and a third zone 93.

The air blown out from blower device 61 flows into first zone 91, second zone 92 and third zone 93 in the axial direction about center axis 130. Second zone 92 is disposed on the downstream side of the airflow in air flow passage 90 relative to first zone 91. Second zone 92 is connected to an end section of first zone 91 on the downstream side of the air flow in air flow passage 90. Third zone 93 is disposed on the downstream side of the airflow in air flow passage 90 relative to second zone 92. Third zone 93 is connected to an end section of second zone 92 on the downstream side of the airflow in air flow passage 90.

As shown in FIG. 8 to FIG. 10, first zone 91 exists from space 210 as the starting point in an angle range of less than 90° around center axis 130. The flow passage area of expanded flow passage section 150 in first zone 91 increases from the upstream side of the airflow toward the downstream side of the airflow (S1<S2). In first zone 91, the flow passage depth in the axial direction about center axis 130 increases from the upstream side of the airflow in air flow passage 90 toward the downstream side of the airflow in air flow passage 90 (H1<H2), and the flow passage width in the radial direction about center axis 130 is constant (B1=B2).

In first zone 91, the radius of outer circumferential side wall section 162 around center axis 130 is constant. The distance between inner circumferential side wall section 161 and outer circumferential side wall section 162 is constant regardless of the position on air flow passage 90 along the air flowing direction.

As shown in FIG. 8, FIG. 10 and FIG. 11, second zone 92 exists in an angle range of 90° around center axis 130. The flow passage area of expanded flow passage section 150 in second zone 92 increases from the upstream side of the airflow toward the downstream side of the airflow (S2<S3). In second zone 92, the flow passage depth in the axial direction about center axis 130 and the flow passage width in the radial direction about center axis 130 increase from the upstream side of the airflow in air flow passage 90 toward the downstream side of the airflow in air flow passage 90 (H2<H3, B2<B3).

In second zone 92, the radius of outer circumferential side wall section 162 around center axis 130 increases from the upstream side of the airflow in air flow passage 90 toward the downstream side of the airflow in air flow passage 90.

As shown in FIG. 8, FIG. 11 to FIG. 13, third zone 93 exists in an angle range of more than 90° and less than 180° around center axis 130. The flow passage area of expanded flow passage section 150 in third zone 93 increases from the upstream side of the airflow toward the downstream side of the airflow (S3<S4<S5). In third zone 93, the flow passage depth in the axial direction about center axis 130 is constant, and the flow passage width in the radial direction about center axis 130 increases from the upstream side of the airflow in air flow passage 90 toward the downstream side of the airflow in air flow passage 90 (H3=H4=H5, B3<B4<B5).

In third zone 93, the radius of outer circumferential side wall section 162 around center axis 130 increases from the upstream side of the airflow in air flow passage 90 toward the downstream side of the airflow in air flow passage 90. Outer circumferential side wall section 162 in second zone 92 and third zone 93 may have a locus that extends along a logarithmic spiral, as viewed in the axial direction about center axis 130. It is preferable that a bottom section of air flow passage 90 is connected by a curved surface, to inner circumferential side wall section 161 and outer circumferential side wall section 162 that form side sections of air flow passage 90. The angle range of second zone 92 around center axis 130 is larger than the angle range of first zone 91 around center axis 130. The angle range of third zone 93 around center axis 130 is larger than the angle range of second zone 92 around center axis 130.

In this configuration, in first zone 91, the flow passage area of expanded flow passage section 150 gradually increases with the increase in the flow passage depth, and therefore it is possible to realize a smooth airflow. Moreover, in first zone 91, the flow passage width is constant, and therefore it is possible to reduce the width W of air guide member 81 shown in FIG. 8. Thereby, it is possible to compactly configure air guide member 81.

Moreover, in second zone 92, the flow passage area of expanded flow passage section 150 quickly increases with the increase in the flow passage depth and the flow passage width, and therefore it is possible to realize a further smooth airflow.

Moreover, in third zone 93, the flow passage area of expanded flow passage section 150 gradually increases with the increase in the flow passage width, and therefore it is possible to realize a smooth airflow. Moreover, in third zone 93, the flow passage depth is constant, and therefore it is possible to reduce the thickness T of air guide member 81 shown in FIG. 4. Thereby, it is possible to further compactly configure air guide member 81.

The above-described structure of operation panel 10 for the machine tool in Embodiment 1 of the invention is summarized as follows. Operation panel 10 for the machine tool in the embodiment includes first case 31U as a case that accommodates heatsink 47 as a cooling target object, blower device 61 that is disposed in first case 31U, and air guide member 81 that forms air flow passage 90 in first case 31U and that guides the air blown out from blower device 61 toward heatsink 47 through air flow passage 90. Air flow passage 90 includes expanded flow passage section 150 in which the flow passage area of air flow passage 90 increases from the upstream side of the airflow toward the downstream side of the airflow.

According to operation panel 10 for the machine tool in Embodiment 1 of the invention configured in this way, since expanded flow passage section 150 in which the flow passage area increases from the upstream side of the airflow toward the downstream side of the airflow is provided in air flow passage 90, it is possible to cause the air to smoothly flow through air flow passage 90. Thereby, it is possible to efficiently cool heatsink 47 that is accommodated in first case 31U.

In the embodiment, the case where the blower device in the present invention is an axial-flow type has been described, but without being limited to this, the blower device in the present invention may be a sirocco fan or may be a cross flow fan, for example.

Embodiment 2

Figure 14:
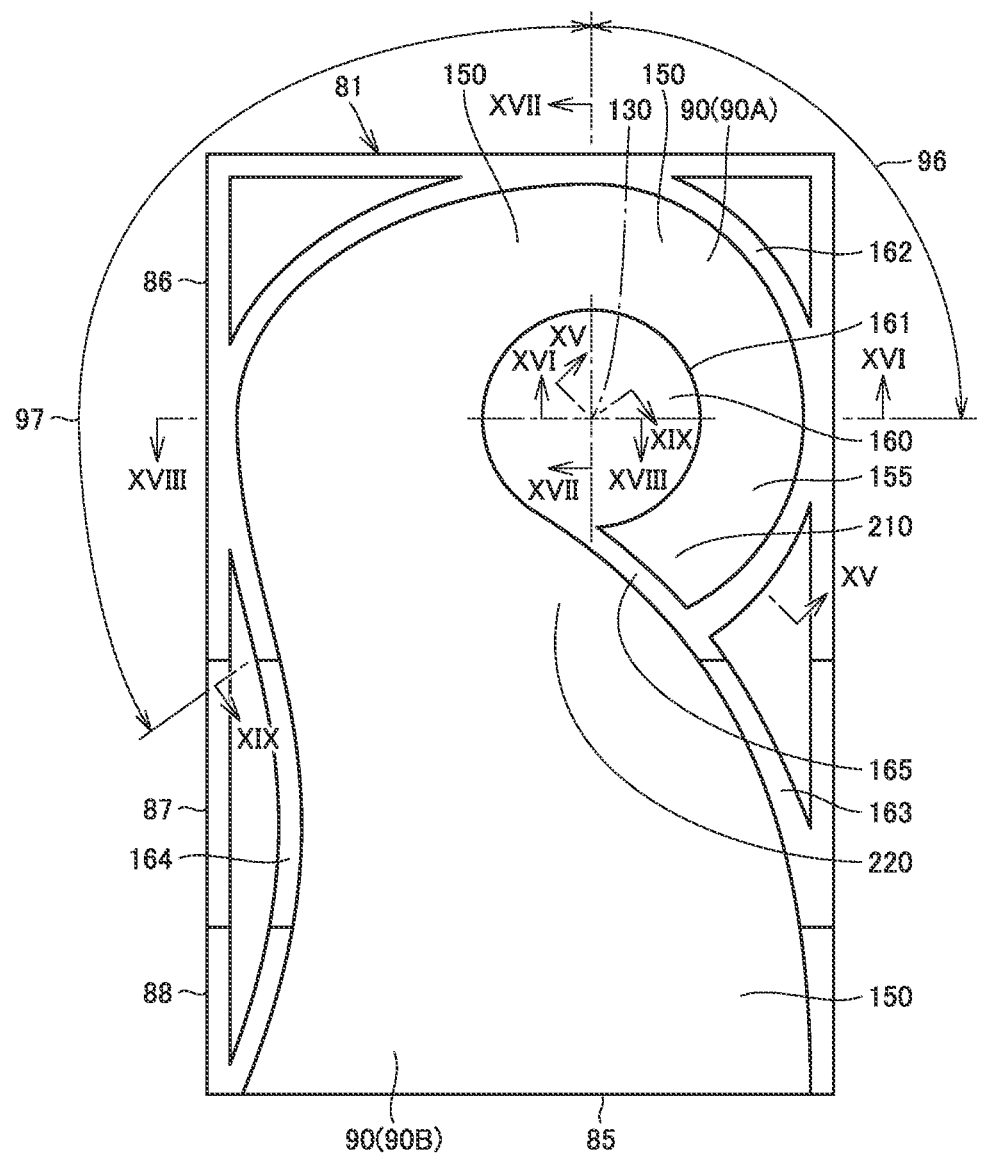
FIG. 14 is a plan view showing the internal structure of an air guide member of an operation panel in Embodiment 2 of the invention.
Figure 15:
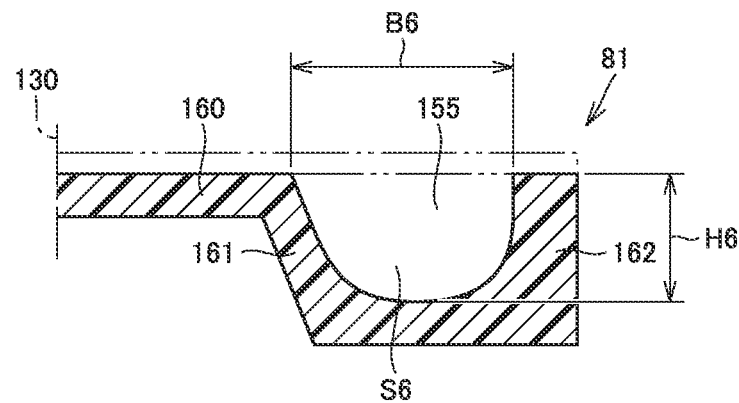
FIG. 15 is a sectional view showing the air guide member as viewed in the direction of the arrow on line XV-XV in FIG. 14.
Figure 16:
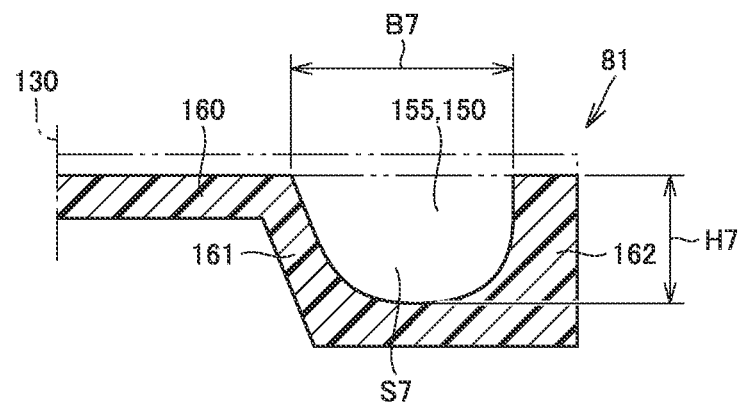
FIG. 16 is a sectional view showing the air guide member as viewed in the direction of the arrow on line XVI-XVI in FIG. 14.
Figure 17:
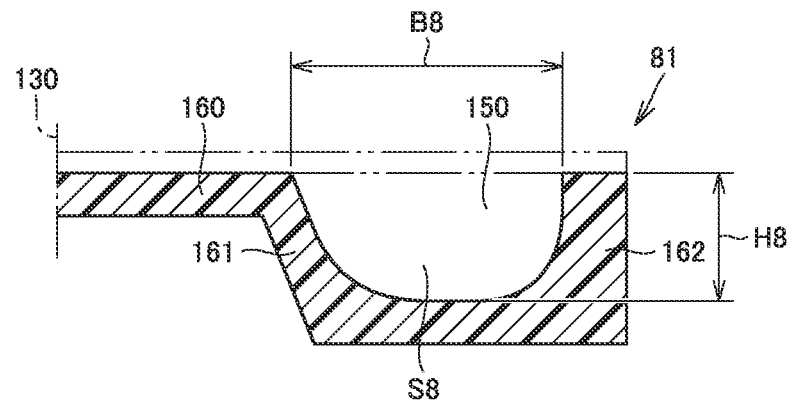
FIG. 17 is a sectional view showing the air guide member as viewed in the direction of the arrow on line XVII-XVII in FIG. 14.
Figure 18:
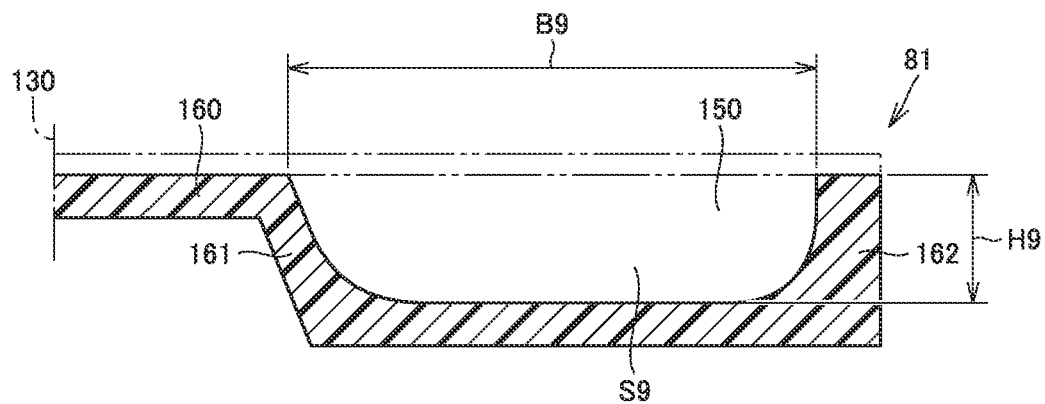
FIG. 18 is a sectional view showing the air guide member as viewed in the direction of the arrow on line XVIII-XVIII in FIG. 14.
Figure 19:
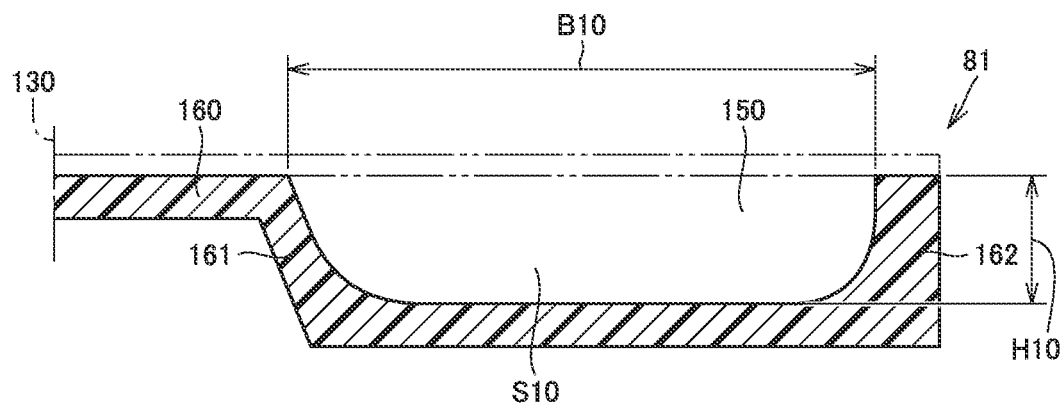
FIG. 19 is a sectional view showing the air guide member as viewed in the direction of the arrow on line XIX-XIX in FIG. 14.

FIG. 14 is a plan view showing the internal structure of an air guide member of an operation panel in Embodiment 2 of the invention. FIG. 14 corresponds to FIG. 8 in Embodiment 1. FIG. 15 is a sectional view showing the air guide member as viewed in the direction of the arrow on line XV-XV in FIG. 14. FIG. 16 is a sectional view showing the air guide member as viewed in the direction of the arrow on line XVI-XVI in FIG. 14. FIG. 17 is a sectional view showing the air guide member as viewed in the direction of the arrow on line XVII-XVII in FIG. 14. FIG. 18 is a sectional view showing the air guide member as viewed in the direction of the arrow on line XVIII-XVIII in FIG. 14. FIG. 19 is a sectional view showing the air guide member as viewed in the direction of the arrow on line XIX-XIX in FIG. 14.

The operation panel in the embodiment basically has the same structure compared to operation panel 10 in Embodiment 1. Hereinafter, descriptions about overlapping structures are not repeated.

With reference to FIG. 14 to FIG. 19, in the embodiment, air flow passage 90 includes a constant flow passage section 155 and an expanded flow passage section 150. As shown in FIG. 14 to FIG. 16, constant flow passage section 155 is provided at a position that corresponds to first zone 91 of round section 90A in Embodiment 1. Constant flow passage section 155 has a constant flow passage area, regardless of the position on air flow passage 90 in the air flowing direction (S6=S7). In constant flow passage section 155, the flow passage depth in the axial direction about center axis 130 is constant (H6=H7), and the flow passage width in the radial direction about center axis 130 is constant (B6=B7).

As shown in FIG. 14, expanded flow passage section 150 is provided at a position that corresponds to second zone 92 and third zone 93 of round section 90A in Embodiment 1 and extension section 90B in Embodiment 1. Expanded flow passage section 150 (round section 90A) includes a fourth zone 96 at a position that corresponds to second zone 92 of round section 90A in Embodiment 1. Expanded flow passage section 150 (round section 90A) includes a fifth zone 97 at a position that corresponds to third zone 93 of round section 90A in Embodiment 1.

As shown in FIG. 14, FIG. 16 and FIG. 17, the flow passage area of expanded flow passage section 150 in fourth zone 96 increases from the upstream side of the airflow toward the downstream side of the airflow (S7<S8). In fourth zone 96, the flow passage depth in the axial direction about center axis 130 is constant, and the flow passage width in the radial direction about center axis 130 increases from the upstream side of the airflow in air flow passage 90 toward the downstream side of the airflow in air flow passage 90 (H7=H8, B7<B8).

As shown in FIG. 14 and FIG. 17 to FIG. 19, the flow passage area of expanded flow passage section 150 in fifth zone 97 increases from the upstream side of the airflow toward the downstream side of the airflow (S8<S9<S10). In fifth zone 97, the flow passage depth in the axial direction about center axis 130 is constant, and the flow passage width in the radial direction about center axis 130 increases from the upstream side of the airflow in air flow passage 90 toward the downstream side of the airflow in air flow passage 90 (H8=H9=H10, B8<B9<B10).

In the embodiment, air flow passage 90 is constituted by constant flow passage section 155 and expanded flow passage section 150, and does not include a zone in which the flow passage area decreases from the upstream side of the airflow toward the downstream side of the airflow.

According to the operation panel for the machine tool in Embodiment 2 of the invention configured in this way, it is possible to exert the effect described in Embodiment 1 similarly.

It should be understood that the embodiments disclosed herein are examples and are not limitative in all respects. It is intended that the scope of the present invention is shown not by the above description but by the claims and includes all alterations within a meaning and range equivalent to the claims.

INDUSTRIAL APPLICABILITY

The invention is applied to an operation panel that is used for a machine tool.

REFERENCE SIGNS LIST

10 operation panel, 21 cover body, 23 front cover, 25 door section, 26 opening section, 31 case, 31L second case, 31U first case, 32 operation section, 36 display section, 41 display device, 42 substrate, 43 electronic component, 44 radiator plate, 45 fin, 47 heatsink, 52 opposed wall, 53 intake port, 54 air passage, 55 partition wall section, 57 end section, 61 blower device, 62 motor, 63 center axis section, 64 first disk section, 65 cylinder section, 66 blade section, 67 second disk section, 68, 68*j* rib section, 70 fan guard, 71 wire, 81 air guide member, 84 upstream-side opening section, 85 downstream-side opening section, 86 first planar section, 87 inclined section, 88 second planar section, 90 air flow passage, 90A round section, 90B extension section, 91 first zone, 92 second zone, 93 third zone, 96 fourth zone, 97 fifth zone, 100 machine tool, 120 pivoting center axis, 130 center axis, 150 expanded flow passage section, 155 constant flow passage section, 160 peak section, 161 inner circumferential side wall section, 162 outer circumferential side wall section, 163 first side wall section, 164 second side wall section, 165 wall section, 210, 220 space

The invention claimed is:

1. An operation panel for a machine tool, comprising:
a case that accommodates a cooling target object;
a blower device that is disposed in the case; and
an air guide member that forms an air flow passage in the case and that guides air blown out from the blower device toward the cooling target object through the air flow passage, wherein
the air flow passage includes an expanded flow passage section in which a flow passage area of the air flow passage increases from an upstream side of an airflow toward a downstream side of the airflow, wherein
the blower device includes a plurality of blade sections that is disposed so as to be spaced from each other in a circumferential direction about a predetermined axis and that rotates around the predetermined axis,
the expanded flow passage section extends in the circumferential direction about the predetermined axis
the blower device is an axial-flow type that blows out air in an axial direction about the predetermined axis, and
the expanded flow passage section extends in the circumferential direction about the predetermined axis, at a position that faces the plurality of blade sections in the axial direction about the predetermined axis.

2. The operation panel for the machine tool according to claim 1, wherein:
the blower device further includes
a center axis section that has a circular columnar shape around the predetermined axis and that is disposed on a radial-directional inside about the predetermined axis relative to the plurality of blade sections,
a motor that is accommodated in the center axis section,
a fan guard that surrounds outer circumferences of the plurality of blade sections, and
a rib section that extends between the center axis section and the fan guard and along which a wire from the motor is routed;
the air guide member includes a wall section that is disposed at a position that overlaps with the rib section as viewed in the axial direction about the predetermined axis; and
the expanded flow passage section extends around the center axis section from a starting point that is one space separated by the wall section, and further extends in a direction of getting away from the center axis section through the other space separated by the wall section, as viewed in the axial direction about the predetermined axis.

3. The operation panel for the machine tool according to claim 1, wherein the expanded flow passage section includes a first zone into which the air blown out from the blower device flows, in which a flow passage depth in the axial direction about the predetermined axis increases from the upstream side of the airflow toward the downstream side of the airflow, and in which a flow passage width in a radial direction about the predetermined axis is constant.

4. The operation panel for the machine tool according to claim 3, wherein the expanded flow passage section further includes a second zone into which the air blown out from the blower device flows, that is disposed on the downstream side of the airflow relative to the first zone, and in which the flow passage depth in the axial direction about the predetermined axis and the flow passage width in the radial direction about the predetermined axis increase from the upstream side of the airflow toward the downstream side of the airflow.

5. The operation panel for the machine tool according to claim 4, wherein the expanded flow passage section further includes a third zone into which the air blown out from the blower device flows, that is disposed on the downstream side of the airflow relative to the second zone, in which the flow passage depth in the axial direction about the predetermined axis is constant, and in which the flow passage width in the radial direction about the predetermined axis increases from the upstream side of the airflow toward the downstream side of the airflow.

6. The operation panel for the machine tool according to claim 1, further comprising an electronic component, wherein
the cooling target object is a heatsink that is disposed so as to be stacked on the electronic component in the axial direction about the predetermined axis and that is connected to the electronic component;

the air guide member includes a first planar section to which the blower device is connected and that extends in a planar direction orthogonal to the predetermined axis, a second planar section on which an opening section is provided, that is disposed at a position away from the first planar section in a radial direction about the predetermined axis and deviating from the first planar section in the axial direction about the predetermined axis, and that extends in the planar direction orthogonal to the predetermined axis, the opening section being a section where the air flow passage is opened toward a radial-directional outside about the predetermined axis, and an inclined section that extends between the first planar section and the second planar section in an oblique direction with respect to the predetermined axis;

the blower device, the second planar section and the heatsink are provided so as to be arrayed in this order from the radial-directional inside about the predetermined axis to the radial-directional outside about the predetermined axis; and the first planar section and the electronic component are provided so as to be arrayed in this order from the radial-directional inside about the predetermined axis to the radial-directional outside about the predetermined axis.

* * * * *